United States Patent
Lee et al.

(10) Patent No.: US 8,426,852 B2
(45) Date of Patent: Apr. 23, 2013

(54) TRANSISTORS AND ELECTRONIC APPARATUSES INCLUDING SAME

(75) Inventors: Jae-cheol Lee, Suwon-si (KR); Chang-seung Lee, Yongin-si (KR); Jae-gwan Chung, Seoul (KR); Eun-ha Lee, Seoul (KR); Anass Benayad, Yongin-si (KR); Sang-wook Kim, Yongin-si (KR); Se-jung Oh, Seoul (KR)

(73) Assignees: Samsung Electronics Co., Ltd., Gyeonggi-do (KR); SNU R&DB Foundation, Seoul (KR)

( * ) Notice: Subject to any disclaimer, the term of this patent is extended or adjusted under 35 U.S.C. 154(b) by 116 days.

(21) Appl. No.: 12/923,089

(22) Filed: Sep. 1, 2010

(65) Prior Publication Data
US 2011/0133176 A1   Jun. 9, 2011

(30) Foreign Application Priority Data
Dec. 8, 2009   (KR) .................. 10-2009-0121407

(51) Int. Cl.
*H01L 29/12* (2006.01)
(52) U.S. Cl.
USPC ........ 257/43; 438/85; 438/104; 257/E21.006; 257/E29.068
(58) Field of Classification Search .......... 257/43, 257/E21.006, E29.068; 438/85, 104
See application file for complete search history.

(56) References Cited

U.S. PATENT DOCUMENTS

| | | | |
|---|---|---|---|
| 7,485,397 B2 | 2/2009 | Eck et al. | |
| 7,691,666 B2 * | 4/2010 | Levy et al. | 438/104 |
| 7,750,343 B2 * | 7/2010 | Choi et al. | 257/40 |
| 7,800,102 B2 * | 9/2010 | Park et al. | 257/40 |
| 7,923,722 B2 * | 4/2011 | Ryu et al. | 257/43 |
| 7,982,216 B2 * | 7/2011 | Imai | 257/43 |
| 2003/0231851 A1 | 12/2003 | Rantala et al. | |
| 2005/0029514 A1 * | 2/2005 | Moriya | 257/40 |
| 2006/0202191 A1 * | 9/2006 | Gerlach et al. | 257/40 |
| 2007/0087489 A1 * | 4/2007 | Park et al. | 438/149 |
| 2007/0241327 A1 * | 10/2007 | Kim et al. | 257/43 |
| 2008/0012010 A1 * | 1/2008 | Myung-Seok et al. | 257/40 |
| 2008/0149921 A1 * | 6/2008 | Choi et al. | 257/40 |
| 2008/0296568 A1 * | 12/2008 | Ryu et al. | 257/43 |
| 2009/0032809 A1 * | 2/2009 | Kim et al. | 257/40 |

FOREIGN PATENT DOCUMENTS

| | | |
|---|---|---|
| JP | 04-280802 A | 10/1992 |
| JP | 10-324505 A | 12/1998 |
| JP | 11-292520 A | 10/1999 |
| JP | 2005159169 A | 6/2005 |
| KR | 20040109988 A | 12/2004 |

* cited by examiner

*Primary Examiner* — Wai Sing Louie
*Assistant Examiner* — William Harriston
(74) *Attorney, Agent, or Firm* — Harness, Dickey & Pierce, P.L.C.

(57) ABSTRACT

Transistors and electronic apparatuses including the same are provided, the transistors include a channel layer on a substrate. The channel layer includes a zinc (Zn)-containing oxide. The transistors include a source and a drain, respectively, contacting opposing ends of the channel layer, a gate corresponding to the channel layer, and a gate insulating layer insulating the channel layer from the gate. The channel layer has a first surface adjacent to the substrate, a second surface facing the first surface, and a channel layer-protection portion on the second surface. The channel layer-protection portion includes a fluoride material.

6 Claims, 8 Drawing Sheets

TRANSISTORS AND ELECTRONIC APPARATUSES INCLUDING SAME

CROSS-REFERENCE TO RELATED APPLICATIONS

This application claims the benefit of priority under 35 U.S.C. §119 from Korean Patent Application No. 10-2009-0121407, filed on Dec. 8, 2009, in the Korean Intellectual Property Office, the disclosure of which is incorporated herein in its entirety by reference.

BACKGROUND

1. Field

Example embodiments relate to transistors and electronic apparatuses including the same.

2. Description of the Related Art

Transistors are widely used as switching devices or driving devices in electronic apparatuses. For example, thin film transistors are used in electronic apparatuses (e.g., liquid crystal display apparatuses or organic light-emitting display apparatuses) because the transistors can be mounted on a glass substrate or a plastic substrate.

In order to increase the operational characteristics of transistors, there have been many attempts to use an oxide layer having a substantially high carrier mobility as a channel layer. However, the oxide layer may deteriorate from, for example, exposure to water vapors, oxygen and/or hydrogen.

SUMMARY

Example embodiments relate to transistors and electronic apparatuses including the same.

Provided are transistors in which deterioration of a channel layer by exposure to water vapors, oxygen and/or hydrogen is prevented (or reduced). Provided are electronic apparatuses including the transistors.

Additional aspects will be set forth in part in the description which follows and, in part, will be apparent from the description, or may be learned by practice of the presented embodiments.

According to example embodiments, a transistor includes a substrate, a channel layer including a zinc (Zn)-containing oxide, a source and a drain respectively contacting opposing ends of the channel layer, a gate corresponding to the channel layer, and a gate insulating layer insulating the channel layer from the gate, wherein the channel layer has a first surface adjacent to the substrate and a second surface facing the first surface, and a channel layer-protection portion including a fluoride material is formed on (or in) the second surface.

The channel layer-protection portion including the fluoride material may include a first region including at least one group (i.e., a functional group) represented by Formula (1), shown below.

FORMULA (1)

In Formula (1), each $X_1$ is selected from the group consisting of hydrogen, fluorine (—F), a C1-C30 alkyl group and a C1-C30 alkyl group substituted with at least one fluorine (—F). $X_1$ may be selected from the group consisting of —F, —$CH_3$, and —$CF_3$.

In Formula (1), * denotes a bonding site with the second surface, provided that the case where all of the $X_1$ are hydrogen or all of the $X_1$ are a C1-C30 alkyl group is excluded. In Formula (1), * may denote a bonding site with the second surface wherein the second surface is modified to include the group represented by Formula (1). Alternatively, in Formula (1), * may denote a bonding site with the second surface wherein a coating having the group represented by Formula (1) is provided on the second surface.

A hydrophilic group on the second surface may be substituted with the group represented by Formula (1).

The channel layer-protection portion including the fluoride material may include a fluoride material-containing layer. The fluoride material-containing layer may include at least one selected from the group consisting of polyfluorovinylidene, fluoroolefin, polytetrafluoroethylene, polyhexafluoroethylene, fluoroethylenepropylene, perfluoropolyether, perfluorophenylene, perfluorobiphenylene, perfluoronaphthalene, polyvinylfluorocinnamate and combinations thereof.

The Zn-containing oxide may include a first component, wherein the first component is selected from the group consisting of hafnium (Hf), yttrium (Y), tantalum (Ta), zirconium (Zr), gallium (Ga), aluminum (Al), indium (In), iron (Fe), scandium (Sc), lutetium (Lu), ytterbium (Yb), thulium (Tm), erbium (Er), holmium (Ho), manganese (Mn), cobalt (Co), nickel (Ni), titanium (Ti), germanium (Ge), copper (Cu), molybdenum (Mo) and combinations thereof.

According to example embodiments, an electronic device may include the transistor described above. The electronic device may be, for example, an organic light-emitting device or a liquid crystal display device.

BRIEF DESCRIPTION OF THE DRAWINGS

Example embodiments will be more clearly understood from the following detailed description taken in conjunction with the accompanying drawings. FIGS. 1A, 1B, 2A, 2B, 3, 4, 5A, 5B, 6A and 6B represent non-limiting, example embodiments as described herein.

DETAILED DESCRIPTION

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to transistors and electronic apparatuses including the same.

A transistor according to example embodiments includes a substrate, a channel layer including a zinc (Zn)-containing oxide, a source and a drain respectively contacting (opposing) ends of the channel layer, a gate corresponding to the channel layer, and a gate insulating layer insulating the channel layer from the gate. The channel layer may have a first surface adjacent to the substrate and a second surface facing the first surface. A channel layer-protection portion including a fluoride material may be formed in (or on) the second surface.

The transistor may have a bottom gate structure, or a top gate structure, depending on the desired location of the gate.

The channel layer of the transistor may include the channel layer-protection portion. The channel layer-protection portion including a fluoride material may prevent (or reduce), for example, permeation of water vapors, oxygen and/or hydrogen into the channel layer, and/or absorption of water vapors, oxygen and/or hydrogen by the channel layer, thereby preventing (or reducing the likelihood of) deterioration of the channel layer. The channel layer-protection portion including a fluoride material may include, for example, a first region including a group represented by Formula (1) (which will be described later), or a fluoride material-containing layer (which will be described later).

Hereinafter, the transistors, the methods of manufacturing the transistor, and the electronic apparatuses including the transistors will be described in detail with reference to the attached drawings.

Figure 1A:
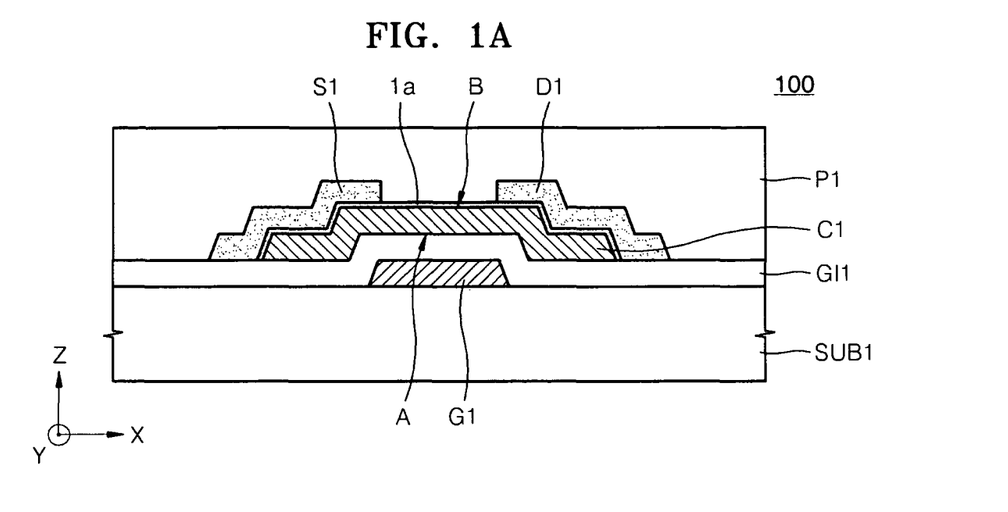
FIGS. 1A, 1B, 2A, and 2B are cross-sectional views of transistors according to example embodiments.

FIG. 1A is a cross-sectional view of a transistor according to example embodiments.

In FIG. 1A, a transistor 100 includes a substrate (SUB1), a gate (G1), a gate insulating layer (GI1), a channel layer (C1), a source (S1)/drain (D1) and a passivation layer (P1), which are sequentially formed in the stated order. The transistor 100 of FIG. 1A has a bottom gate structure in which the gate (G1) is interposed between the channel layer (C1) and the substrate (SUB1).

Referring to FIG. 1A, the gate (G1) may be formed on the substrate (SUB1). The gate (G1) may be formed directly on the substrate (SUB1). The substrate (SUB1) may be a glass substrate. However, the substrate (SUB1) may be one of various substrates used in conventional semiconductor device manufacturing processes, for example, a plastic substrate or a silicon substrate.

The gate (G1) may be formed of a conventional electrode material (e.g., metal). The gate (G1) may include aluminum (Al), hafnium (Hf), zirconium (Zr), zinc (Zn), tungsten (W), cobalt (Co), gold (Au), platinum (Pt), ruthenium (Ru), iridium (Ir), titanium (Ti), tantalum (Ta), nickel (Ni), silver (Ag), molybdenum (Mo), copper (Cu), palladium (Pd), indium (In), tin (Sn), an oxide containing at least one of the aforementioned metals and combinations thereof. For example, the gate (G1) may include indium tin oxide (ITO), indium zinc oxide (IZO) or similar compounds. The gate (G1) may also include other materials.

The gate insulating layer (GI1) may cover the gate (G1) and insulate the gate (G1) from the source (S1) and drain (D1) and/or the channel layer (C1). The gate insulating layer (GI1) may be formed on (and/or directly contact) the substrate (SUB1). The gate insulating layer (GI1) may be a silicon oxide layer or a silicon nitride layer. The gate insulating layer (GI1) may also be a material layer having a large dielectric constant. For example, the gate insulating layer (GI1) may be a material layer having a larger dielectric constant than, for example, a silicon nitride layer. Alternatively, the gate insulating layer (GI1) may include at least two layers selected from the group consisting of the silicon oxide layer, the silicon nitride layer and the material layer having a large dielectric constant.

The channel layer (C1) may be formed on (and/or directly contact) the gate insulating layer (GI1). The channel layer (C1) may include the zinc (Zn)-containing oxide. The position of the channel layer (C1) may depend on the gate (G1). The channel layer (C1) may correspond to the gate (G1). The channel layer (C1) may have a first surface (A) adjacent to the substrate (SUB1) and a second surface (B) facing (or opposite to) the first surface (A).

A first region (1a) of the channel layer (C1) may contain a group (i.e., a functional group) represented by Formula (1) below (hereinafter referred to as "first region (1a)"). The first region (1a) may be formed on, or in (such as a part of) the second surface (B).

Formula (1)

The first region (1a) corresponds to (or is in) the channel layer-protection portion including a fluoride material.

In Formula (1), each $X_1$ is selected from the group consisting of hydrogen, fluorine (—F), a C1-C30 alkyl group and a C1-C30 alkyl group substituted with at least one —F.

In Formula (1), * denotes a bonding site with the second surface (B), provided that the case where all of the $X_1$ are hydrogen or all of the $X_1$ are a C1-C30 alkyl group is excluded. In Formula (1), * may denote a bonding site with the second surface wherein the second surface is modified to include the group represented by Formula (1). Alternatively, in Formula (1), * may denote a bonding site with the second surface wherein a coating having the group represented by Formula (1) is provided on the second surface.

In the first region (1a), a plurality of $X_1$ substituents may be the same as, or different from, each other, with the exception that all of the $X_1$ substituents are not hydrogen atoms.

The first region (1a) is formed on, or in (such as a part of), the second surface (B) of the channel layer (C1). The first region (1a) prevents (or reduces the likelihood of) deterioration of the channel layer (C1) from exposure to water vapors, oxygen and/or hydrogen.

For example, the $X_1$ substituent(s) may be selected from the group consisting of —F, —CH$_3$, and —CF$_3$, but is not limited thereto. For example, $X_1$ may be —F, but is not limited thereto.

Due to the group represented by Formula (1) contained in the first region (1a), a hydrophilic group (e.g., —OH) that exists on the second surface (B) of the channel layer (C1) may be substituted. That is, due to the presence of the first region (1a), the hydrophilic group on the second surface (B) may be removed, or substantially removed.

A fluorine (F) ion-doped region (not shown in FIG. 1A) may be selectively formed under the first region (1a). For example, when the first region (1a) is formed using a plasma treatment method or an ion-plating method, a F ion-doped region may be formed by doping a fluoride (F) ion under the second surface (B) (in addition to the formation of the first region (1a) on, or in, the second surface (B)) depending on the process conditions (e.g., intensity of energy used and fluidity of a material for forming the first region (1a)).

Because the channel layer (C1) contains a zinc-containing oxide, a hydrophilic group may exist on the second surface (B). The hydrophilic group may allow water vapors, oxygen and/or hydrogen to be easily absorbed by the channel layer (C1) through the second surface (B) of the channel layer (C1). As such, the channel layer (C1) may deteriorate. However, because the hydrophilic group on the second surface (B) may be reduced, or substantially removed, due to the presence of the first region (1a), the absorption of water vapors, oxygen and/or hydrogen through the second surface (B) may be reduced (or substantially prevented). As such, deterioration of the channel layer (C1) may be prevented (or reduced).

The channel layer (C1) may include the zinc (Zn)-containing oxide. The zinc-containing oxide may include a first component. The first component may be selected from the group consisting of hafnium (Hf), yttrium (Y), tantalum (Ta), zirconium (Zr), gallium (Ga), aluminum (Al), indium (In), iron (Fe), scandium (Sc), lutetium (Lu), ytterbium (Yb), thulium (Tm), erbium (Er), holmium (Ho), manganese (Mn), cobalt (Co), nickel (Ni), titanium (Ti), germanium (Ge), copper (Cu), molybdenum (Mo) and combinations thereof, but is not limited thereto. For example, the first component may include at least one element selected from the group consisting of Hf, In and combinations thereof, but is not limited thereto.

The thickness of the channel layer (C1) may be in the range of about 1-nm to about 300-nm, for example, about 10-nm to about 200-nm, but is not limited thereto. The thickness of the channel layer (C1) may vary according to the structure of a transistor to be formed, or may vary according to the composition of the zinc (Zn)-containing oxide included in the channel layer (C1).

The source (S1) and the drain (D1) may be formed on the gate insulating layer (GI1). The source (51) and the drain (D1) may respectively contact (opposing) ends of the channel layer (C1). Each of the source (51) and drain (D1) may be a single metal layer, or a plurality of metal layers. The source (S1) and the drain (D1), and the gate (G1) may be the same, or different, metal layers.

The passivation layer (P1) may cover the channel layer (C1), the source (S1), and the drain (D1) on the gate insulating layer (GI1). The passivation layer (P1) may be a silicon oxide layer, a silicon nitride layer, an organic layer or a combination thereof. The passivation layer (P1) may have a stacked structure including at least two of these layers.

The thickness of the gate (G1) may be in the range of about 50-nm to about 300-nm. The thickness of the gate insulating layer (GI1) may be in the range of about 50-nm to about 400-nm. The thickness of the source (S1) and the drain (D1) may be about 10-nm to about 200-nm, and about 10-nm to about 200-nm, respectively. However, example embodiments are not limited thereto. The thicknesses of the gate (G1), the gate insulating layer (GI1), the source (S1) and the drain (D1)

may be easily selected, or modified, by one of ordinary skill in the art according to characteristics of the transistor to be embodied.

Now, a method of manufacturing the transistor of FIG. 1A according to example embodiments will be described in detail.

The gate (G1) is formed on the substrate (SUB1). The gate insulating layer (GI1) is formed on the resultant structure such that the gate insulating layer (GI1) covers the gate (G1). The channel layer (C1) may be formed on the gate (C1). The channel layer (C1) may be formed by depositing a zinc-containing oxide target. When the channel layer (C1) includes the first component (as described above), a first component-containing oxide target may be deposited together with a zinc-containing oxide target, or alternatively a zinc-containing oxide target which contains the first component may be deposited.

The first region (1a) (i.e., the channel layer-protection portion including a fluoride material) may be formed on, or in (such as a part of), the second surface (B) of the channel layer (C1). The first region (1a) may be formed by performing, for example, a plasma treatment process, an ion plating process or a solution treatment process on the second surface (B) of the channel layer (C1).

When the first region (1a) is formed by a plasma treatment process, examples of a material for forming the first region (1a) include hydrogen gas, HF gas, $F_2$ gas, $NF_3$ gas, $NHF_2$ gas, $NH_2F$ gas, a C1-C30 hydrocarbon gas (e.g., $CH_4$, $CH_3CH_3$ gas or a similar gas), and a C1-C30 hydrocarbon substituted with at least one fluorine (—F) gas (e.g., $CF_4$, $CHF_3$, $CH_2F_3$, $CH_3F$, $C2F_6$, $CHF_2CHF_2$ gas or a similar gas), but are not limited thereto. For example, a combination of at least two of these gases may also be used to form the first region (1a). The material for forming the first region (1a) may be used together with an inert gas (e.g., argon or nitrogen gas).

The ion plating process is a type of vacuum deposition process in which gas (e.g., an argon gas) is loaded into a vacuum chamber to form a high vacuum state (e.g., about 10-torr), and then subsequently plasma discharge is induced to ionize the material for forming the first region (1a). Examples of the material for forming the first region (1a) available in the ion plating method have been presented with reference to the plasma treatment process. The material for forming the first region (1a) ionized by the plasma is deposited on the second surface (B) by providing substantially high energy. In this regard, the first region (1a) may be formed by controlling a pressure of the vacuum chamber, plasma energy, and the concentration of the material for forming the first region (1a). When the ion plating process is used, a portion of the material for forming the first region (1a) ionized by the plasma may permeate into the second surface (B) under the region wherein the first region (1a) will be formed due to the high energy.

Examples of the material for forming the first region (1a) material in the solution treatment process may include an alcohol material (e.g., $CH_3OH$, $CH_2CH_5OH$, $CF_3OH$ or a similar alcohol) and a fluoric acid (HF). For example, the first region (1a) may be formed by treating the second surface (B) of the channel layer (C1) with the alcohol material or the HF by, for example, washing, quickly dipping, spraying or a similar technique.

The source (S1) and the drain (D1) respectively contacting (opposing) ends of the channel layer (C1), and exposing a portion of a top surface of the channel layer (C1), may be formed on the gate insulating layer (GI1).

The first region (1a) (i.e., the channel layer-protection portion including a fluoride material) may be formed on the surface of the channel layer (C1) exposed by the source (S1) and the drain (D1). As such, deterioration of the channel layer (C1) from exposure to water vapors, Oxygen and/or hydrogen may be prevented (or reduced).

The passivation layer (P1) covering the exposed surface of the channel layer (C1) and the source (S1) and drain (D1) may be formed on the substrate (SUB1). The passivation layer (P1) may be a silicon oxide layer, a silicon nitride layer, an organic layer or a combination thereof. The passivation layer may have a stacked structure including at least two of the aforementioned layers.

A decrease in the hydrophilic property of the second surface (B) by formation of the first region (1a) may be identified by evaluating a contact angle of an oxide layer corresponding to the channel layer (C1) before and after the formation of the first region (1a).

For example, a zinc oxide layer is formed, and then a contact angle of the zinc oxide layer with respect to water is evaluated via a standard sessile drop contact angle evaluation method. The contact angle of the evaluated zinc oxide layer is, generally, about 35°. Then, a $CF_4$ plasma treatment is performed on a surface of the zinc oxide layer to form a first region containing a group represented by Formula (I) in which the $X_1$ substituent is fluorine (—F) on the surface of the zinc oxide layer. Then, the contact angle of the surface of the zinc oxide layer with respect to water is evaluated via a standard sessile drop contact angle evaluation method. The contact angle of the surface of the zinc oxide layer is, generally, about 95°. That is, the hydrophilic characteristic of the surface of the evaluated zinc oxide layer is significantly weakened by the formation of the first region containing a group represented by Formula (1) in which the $X_1$ substituent is fluorine (—F) and the surface of the zinc oxide layer is substantially changed to a hydrophobic surface.

Alternatively, an oxide layer having a composition of Hf—In—Zn—O is formed, and then a $CF_4$ plasma treatment is performed on a surface of the oxide layer, thereby forming the first region containing a group represented by Formula (1) in which the $X_1$ substituent is fluorine (—F) in a surface of the zinc oxide layer. Then, the contact angle of the oxide layer with respect to water is evaluated according to a standard sessile drop contact angle evaluation method. The contact angle of the oxide layer evaluated is, generally, about 104°. That is, the surface of the oxide layer having the composition of Hf—In—Zn—O becomes substantially hydrophobic due to the formation of the first region containing a group represented by Formula (1) in which the $X_1$ substituent is fluorine (—F).

Figure 1B:
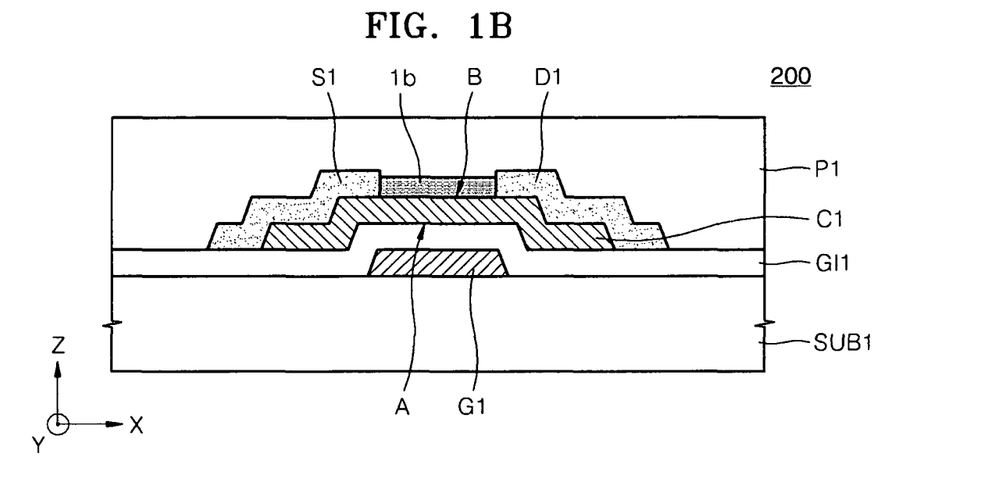

FIG. 1B is a cross-sectional view of a transistor according to example embodiments.

In FIG. 1B, a transistor 200 has the same structure as the transistor 100 of FIG. 1A, except that a fluoride material-containing layer (1b) is formed on the second surface (B) of the channel layer (C1). The fluoride material-containing layer (1b) corresponds to (or is in) the channel layer-protection portion including a fluoride material.

Because permeation of water vapors, oxygen and/or hydrogen into the channel layer (C1), and/or absorption of water vapors, oxygen and/or hydrogen by the channel layer (C1), may be prevented by the fluoride material-containing layer (1b), deterioration of the channel layer (C1) may be substantially prevented by the fluoride material-containing layer (1b).

A fluoride material included in the fluoride material-containing layer (1b) may be any material that contains fluorine (F) to prevent permeation of at least one of water vapors, oxygen, hydrogen or combinations thereof into the channel layer (C1), and/or any material that does not degrade characteristics of the transistor 200.

For example, the fluoride material may be selected from the group consisting of polyfluorovinylidene, fluoroolefin, polytetrafluoroethylene (e.g., Teflon®), polyhexafluoroethylene, fluoroethylenepropylene, perfluoropolyether, perfluorophenylene, perfluorobiphenylene, perfluoronaphthalene, polyvinylfluorocinnamate, and combinations thereof, but is not limited thereto. For example, the fluoride material may be polytetrafluoroethylene.

A maximum thickness of the fluoride material-containing layer (1b) may be in the range of about 10-nm to about 1000-nm, for example, about 100-nm to about 700-nm, but is not limited thereto. The maximum thickness of the fluoride material-containing layer may vary according to the type of a selected fluoride material, or a method of forming the fluoride, material-containing layer.

A metal that is included in the source (S1) and the drain (D1) may have a large surface energy difference with respect to the fluoride material described above. As such, an adhesive force of the source (S1) and the drain (D1) with respect to the fluoride material-containing layer (1b) may be relatively low. Thus, the fluoride material-containing layer (1b) may be patterned such that the fluoride material-containing layer (1b) is not formed under the source (S1) and the drain (D1) as illustrated in FIG. 1B.

The fluoride material-containing layer (1b) may be formed by providing a fluoride material-containing mixture, or a fluoride material precursor-containing mixture, on the second surface (B) of the channel layer (C1), and then subsequently performing a heat treatment.

The fluoride material precursor may be, for example, a monomer (or oligomer) for forming the fluoride material, but is not limited thereto.

The fluoride material-containing mixture, or the fluoride material precursor-containing mixture, may include a solvent to increase fluidity thereof. The solvent may be any solvent that exhibits miscibility with respect to the fluoride material and/or fluoride material precursor, and is easily removable.

Providing the fluoride material-containing mixture, or the fluoride material precursor-containing mixture, on the second surface (B) of the channel layer (C1) may be performed by various known methods (e.g., spin coating, spraying, inkjet printing, dipping, casting, Gravure coating, bar coating, roll coating, wire bar coating, screen coating, flexo coating, offset coating or a similar technique).

The heat treatment may be performed in a temperature range, and/or a time range, in which the solvent included in the fluoride material-containing mixture, or a fluoride material precursor-containing mixture, is removed and the fluoride material precursor is changed into a fluoride material by, for example, radical polymerization, ion reaction polymerization, condensation or a similar technique. The temperature and time ranges may vary according to a boiling point and an amount of the solvent used. The temperature and time ranges may vary according to a formula or an amount of the fluoride material and/or fluoride material precursor used.

The fluoride material-containing layer (1b) may be formed by depositing the fluoride material. A fluoride material that is capable of being deposited is well-known in the art, and may be easily selected by one of ordinary skill in the art.

Figure 2A:
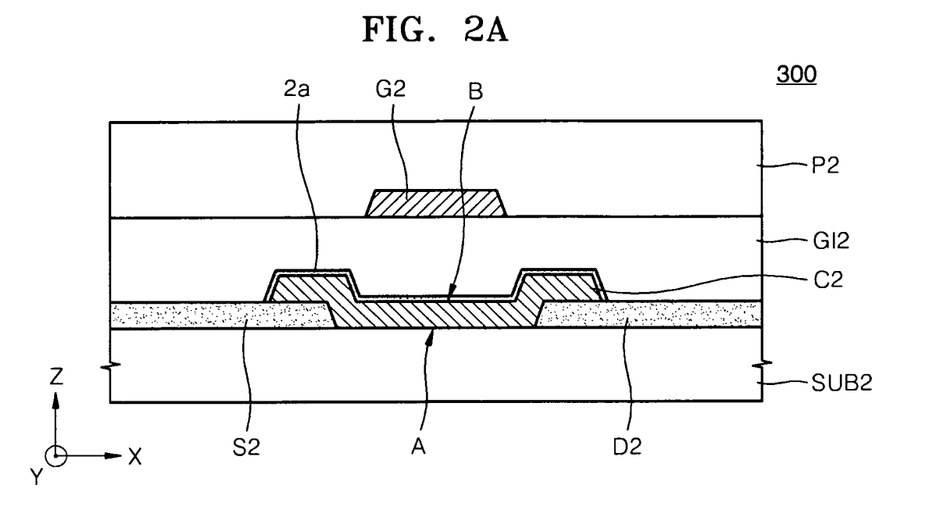

FIG. 2A is a cross-sectional view of a transistor according to example embodiments.

In FIG. 2A, the transistor 300 may include a substrate (SUB2), a source (S2) and a drain (D2), a channel layer (C2), a gate insulating layer (GI2), a gate (G2), and a passivation layer (P2), which are sequentially stacked in this stated order. The transistor 300 has a top gate type structure in which the channel layer (C2) is interposed between the gate (G2) and the substrate (SUB2). The substrate (SUB2), the source (S2) and drain (D2), the channel layer (C2), the gate insulating layer (GI2), the gate (G2) and the passivation layer (P2) of the transistor 300 are identical, if not similar, to the corresponding elements presented above with reference to the transistor 100 of FIG. 1A. Thus, a detailed description thereof is not repeated for the sake of brevity.

A first region (2a) including the group represented by Formula (1) (hereinafter referred to as "first region (2a)"), which corresponds to (or is in) a channel layer-protection portion, may exist in a second surface (B) of the channel layer (C2) facing a first surface (A) of the channel layer (C2) that is adjacent (or nearest) to the substrate (SUB2). The first region (2a), and a method of forming the first region (2a), may be understood by referring to the above detailed description of the first region (1a) illustrated in FIG. 1A, and the method of forming the first region (1a), respectively.

Figure 2B:
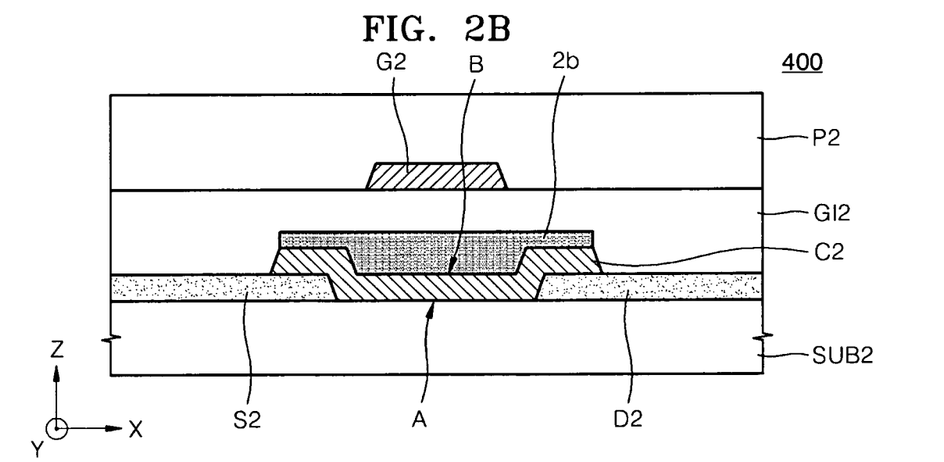

FIG. 2B is a cross-sectional view of a transistor according to example embodiments.

In FIG. 2B, a transistor 400 has the same structure as the transistor of FIG. 2A except that a fluoride material-containing layer (2b) (as the channel layer-protection portion including a fluoride material) is formed on the second surface (B) of the channel layer (C1). The fluoride material-containing layer (2b) and a method of forming the fluoride material-containing layer (2b) may be understood by referring to the above detailed description of the fluoride material-containing layer (1b) illustrated in FIG. 1B and the method of forming the fluoride material-containing layer (1b), respectively.

The transistors described above have, in addition to excellent electrical characteristics, substantially high reliability due to the substantial prevention (or reduction) in the deterioration of a channel layer from exposure to at least one of water vapors, oxygen, hydrogen or combinations thereof. The transistors may be used as switching devices and/or driving devices for various electronic apparatuses. Examples of the electronic apparatuses may include, but are not limited thereto, organic light emitting apparatuses and liquid crystal display apparatuses. For example, when the electronic apparatus is an organic light emitting apparatus, the organic light emitting apparatus may include a transistor according to example embodiments and an organic light emitting device. A source or drain of the transistor may be electrically connected to a pixel electrode of the organic light emitting device.

Figure 3:
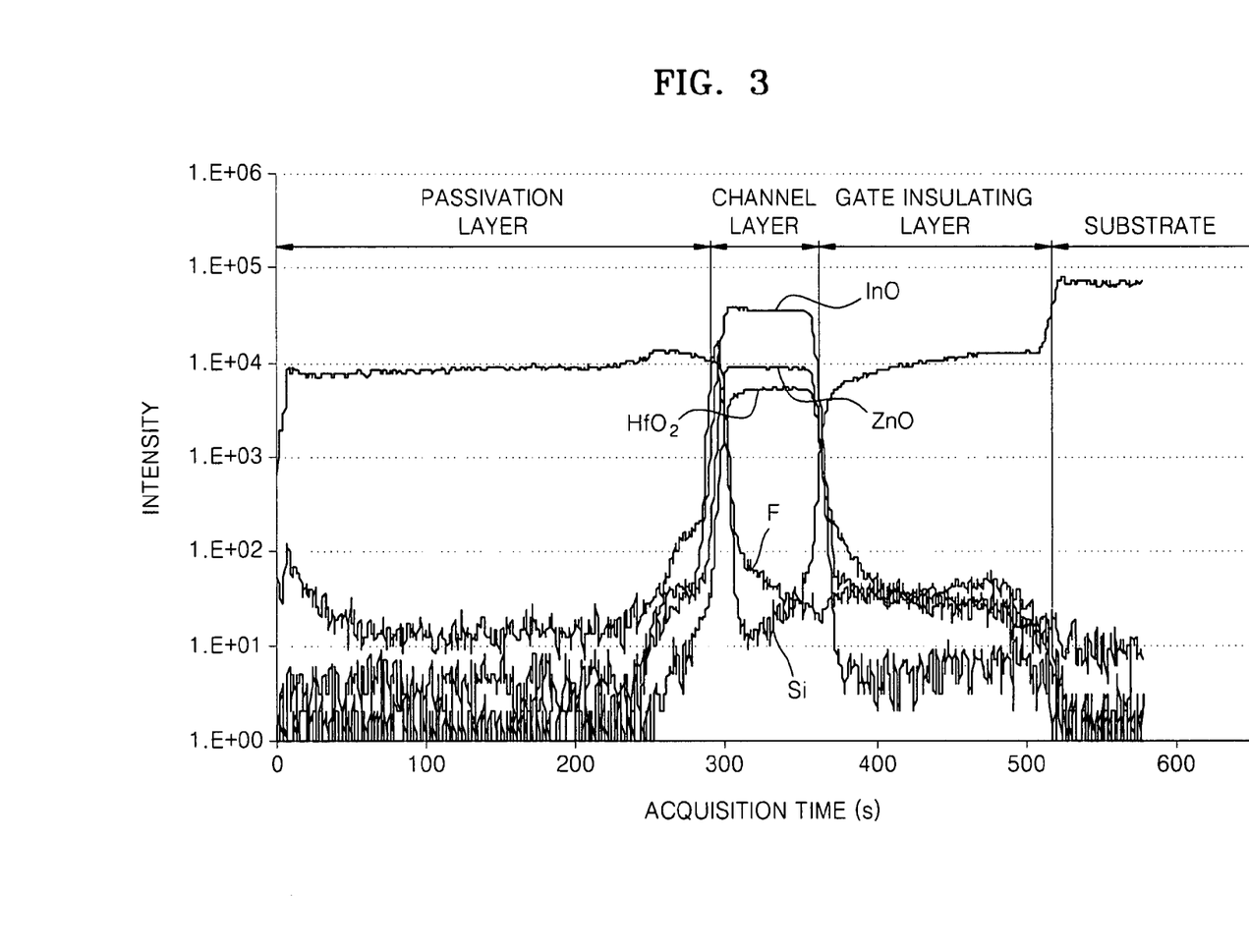
FIG. 3 is a secondary ion mass spectrometry (SIMS) profile graph of Sample 1.

FIG. 3 shows secondary ion mass spectrometer (SIMS) analysis results of Sample 1.

Sample 1 of FIG. 3 is manufactured by sequentially stacking a silicon substrate, a silicon oxide layer (i.e., a gate insulating layer), a Hf—In—Zn—O single layer (i.e., a channel layer (having a thickness of about 50-nm)), and a silicon oxide layer (i.e., a passivation layer) in this stated order. In Sample 1, before the formation of the passivation layer, a surface of the channel layer is treated with $CF_4$ plasma to form a first region including the group represented by Formula (1) in which $X_1$ is fluorine (—F), the first region being characterized as the channel layer-protection portion including a fluoride material.

In order to reduce exposure of Sample 1 to the atmosphere, Sample 1 is placed in a purge system and a portion of the Sample 1 is collected and loaded into a sample holder for SIMS analysis. While sustaining the purge state, the sample holder was placed in a preparation chamber of a SIMS apparatus and the preparation chamber is placed into an experimental chamber by pumping. A depth profile graph of Sample 1 is obtained using an oxygen ion gun.

Referring to FIG. 3, the amount of fluorine (F) in an interface between the passivation layer and the channel layer is highest at the interface, and substantially decreases as the distance from the interface between the passivation layer and the channel layer increases. As such, the region including the group represented by Formula (1) in which $X_1$ is fluorine (—F) is formed in (or on) the surface of the channel layer (corresponding to the second surface (B) of the channel layer (C1) illustrated in FIG. 1A) by the $CF_4$ plasma treatment.

Figure 4:
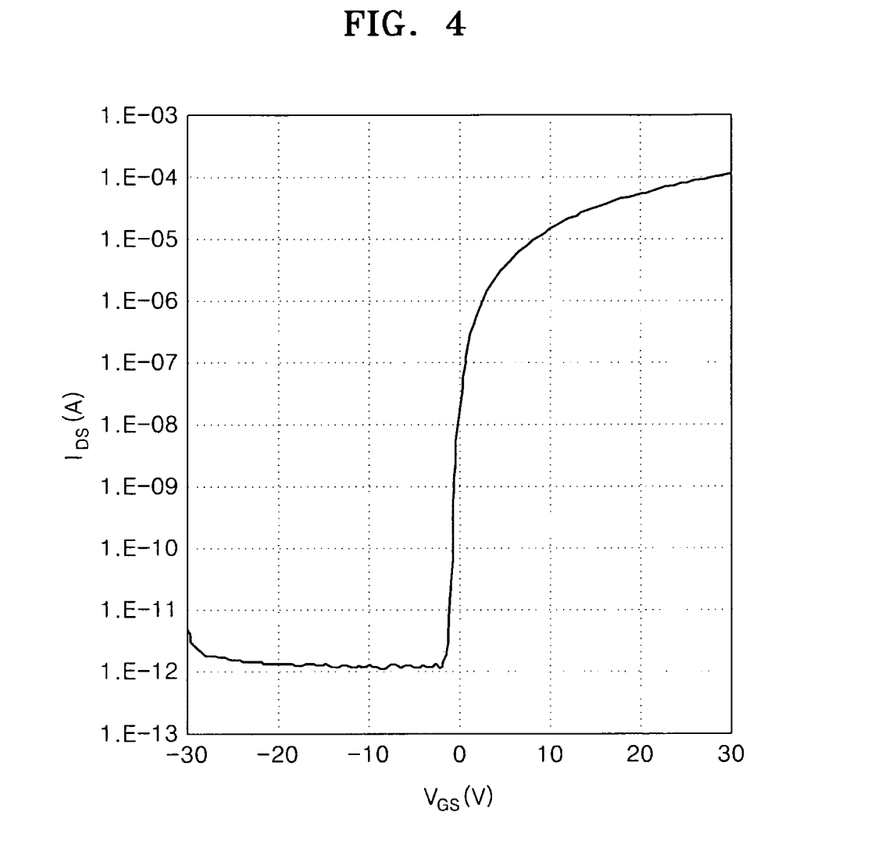
FIG. 4 is a graph showing current-voltage characteristics of a transistor having the structure of FIG. 1A.

FIG. 4 is a graph showing voltage ($V_{GS}$)-current ($I_{DS}$) characteristics of a transistor having the structure of FIG. 1A.

In FIG. 4, the transistor includes a Hf—In—Zn—O single layer (having a thickness of about 50-nm) as a channel layer, and a first region (1a) including the group represented by Formula (1) in which $X_1$ is —F as a channel layer-protection portion including a fluoride material. The first region (1a) is formed in the second surface (B) of the channel layer (C1) by treating the second surface (B) of the channel layer (C1) with $NF_3$ plasma, after the formation of the channel layer (C1) and before the formation of the source (S1) and drain (D1).

Referring to FIG. 4, the first region (1a) including the group represented by Formula (1) in which $X_1$ is —F does not substantially affect the electrical characteristics of the transistor.

Figure 5A:
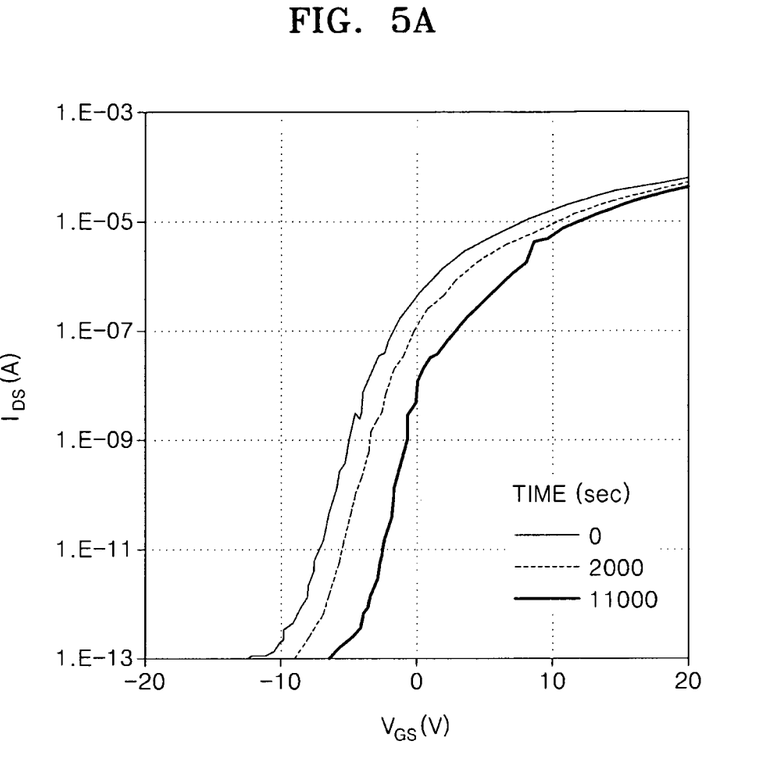
FIGS. 5A and 5B are graphs showing gate voltage ($V_{GS}$)-drain current ($I_{DS}$) characteristics, after light irradiation, of a comparative transistor and a transistor according to example embodiments, respectively.
Figure 5B:
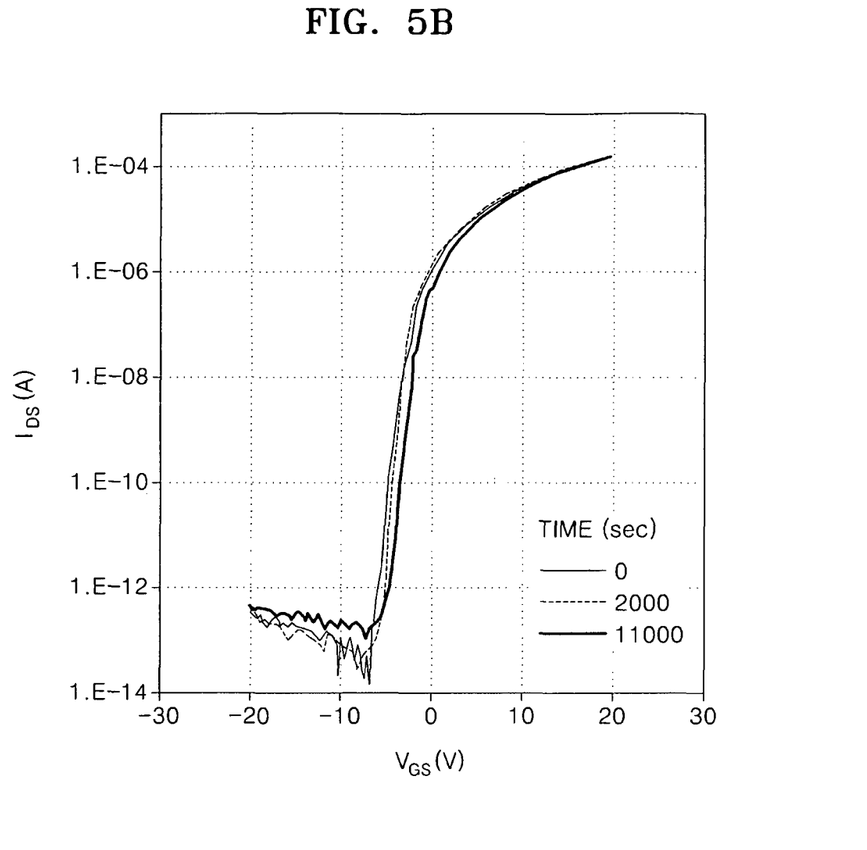

FIGS. 5A and 5B are graphs showing voltage ($V_{GS}$)-current ($I_{DS}$) characteristics of a comparative transistor and a transistor according to example embodiments, respectively, after light irradiation.

In FIGS. 5A and 5B, about 20000 nit of light is irradiated to each of the transistors while voltages of –20-V, 10-V and 0-V are respectively applied to a gate, a drain and a source of each of the transistors. The comparative transistor shown in FIG. 5A has the same structure as the transistor according to example embodiments shown in FIG. 5B, except that the channel layer-protection portion including a fluoride material is not formed (that is, the channel layer (C1) is not treated with $NF_3$ plasma). The transistor according to example embodiments shown in FIG. 5B has the same structure as the comparative transistor shown in FIG. 5A, except that the channel layer (C1) is treated with $CF_4$ plasma instead of $NF_3$ plasma to form the first region (1a).

Referring to FIGS. 5A and 5B, the graphs shift as the light irradiation time increases. In particular, as the light irradiation time increases, the voltage ($V_{GS}$)-current ($I_{DS}$) characteristics of the transistor change. Thus, the characteristics of the transistors (e.g., a threshold voltage) are changed by light irradiation. The shift width of the graph of FIG. 5A (the comparative transistor) is greater than the shift width of the graph of FIG. 5B (the transistor according to example embodiments). That is, according to light irradiation time, characteristics of the transistor according to example embodiments (which includes the channel layer-protection portion having a fluoride material) exhibit a smaller change than the comparative transistor, which does not include the channel layer-protection portion having a fluoride material.

Figure 6A:
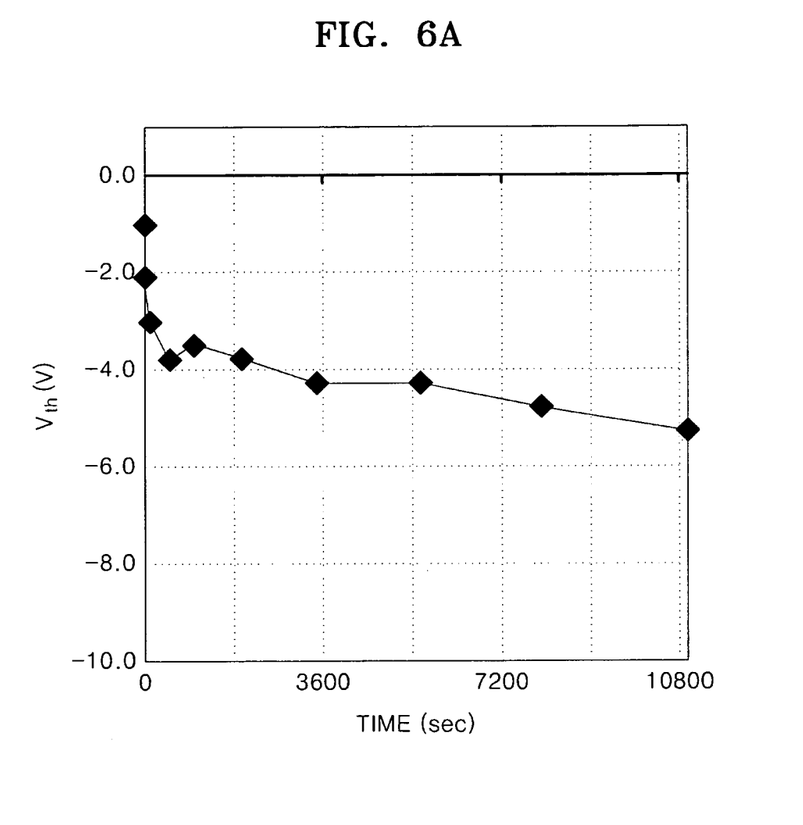
FIGS. 6A and 6B are graphs showing time-threshold voltage ($V_{th}$) characteristics of a comparative transistor and a transistor according to example embodiments, respectively.
Figure 6B:
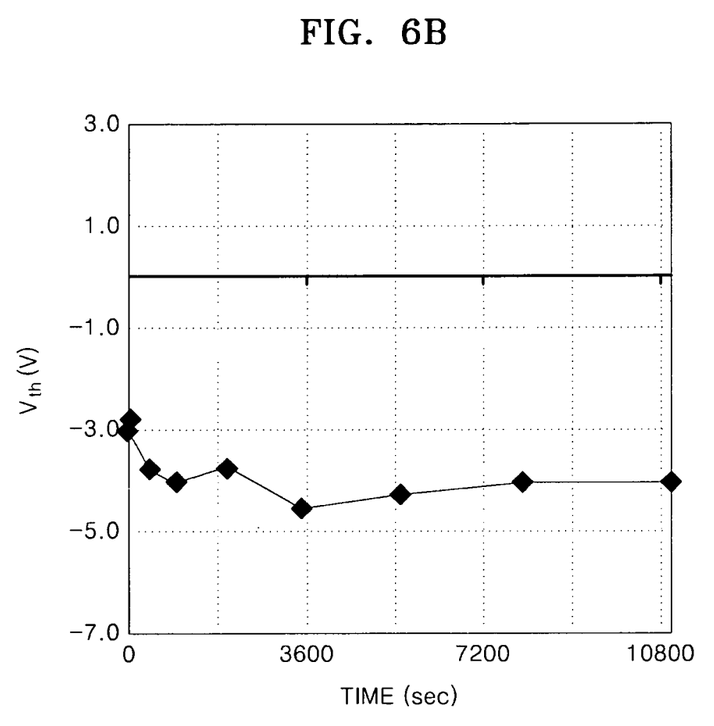

FIGS. 6A and 6B are graphs showing time-threshold voltage ($V_{th}$) characteristics of a comparative transistor and a transistor according to example embodiments, respectively.

The comparative transistor shown in FIG. 6A has the same structure as the transistor according to example embodiments shown in FIG. 6B, except that the channel layer-protection portion including a fluoride material is not formed (that is, the channel layer (C1) is not treated with $NF_3$ plasma). The transistor according to example embodiments shown in FIG. 6B has the same structure as the comparative transistor shown in FIG. 6A, except that the channel layer (C1) is treated with $CF_4$ plasma instead of $NF_3$ plasma to form the first region (1a).

In FIGS. 6A and 6B, a current of 1-nA was provided.

Referring to FIG. 6A, a threshold voltage change ($\Delta V_{th\_1 nA}$) of the comparative transistor at 10800 seconds is about 4.3-V. Referring to FIG. 6B, a threshold voltage change ($\Delta V_{th\_1 nA}$) of the transistor according to example embodiments is about 1.5-V at 10800 seconds. That is, the transistor according to example embodiments, which includes the channel layer-protection portion having a fluoride material, has a smaller threshold voltage change than the comparative transistor, which does not include the channel layer-protection portion including a fluoride material.

Referring to FIGS. 5A, 5B, 6A and 6B, the transistor according to example embodiments, which includes the channel layer-protection portion having a fluoride material, has a higher reliability than the comparative transistor, which that does not include the channel layer-protection portion including a fluoride material.

As described above, in the transistors according to example embodiments, deterioration of a channel layer from exposure to water vapors, oxygen and/or hydrogen may be prevented (or reduced). Thus, devices including a transistor according to example embodiments may be more reliable.

The example embodiments described above are not intended to limit the scope of the invention and rather, should be considered as exemplary embodiments. Although a few example embodiments have been described, those skilled in the art will readily appreciate that many modifications are possible in example embodiments without materially departing from the novel teachings and advantages. For example, it would be obvious to one of ordinary skill in the art that components and structures of the transistors of FIGS. 1A, 1B, 2A, and 2B may be variously changed. For example, the transistors of FIGS. 1A, 1B, 2A, and 2B may have a double gate structure, and/or the channel layer may be planar instead of curved.

Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A transistor, comprising:
   a channel layer on a substrate, the channel layer including a zinc (Zn)-containing oxide;
   a source and a drain, respectively, contacting opposing ends of the channel layer;
   a gate corresponding to the channel layer; and
   a gate insulating layer over the channel layer,
   the channel layer having a first surface adjacent to the substrate, a second surface facing the first surface, and a channel layer-protection portion on the second surface,
   the channel layer-protection portion including a fluoride material,
   the channel layer-protection portion including a first region,
   the channel layer-protection portion including a fluoride material-containing layer having the fluoride material, and
   the fluoride material-containing layer including at least one selected from the group consisting of polyfluorovinylidene, fluoroolefin, polytetrafluoroethylene, polyhexafluoroethylene, fluoroethylenepropylene, perfluoropolyether, perfluorophenylene, perfluorobiphenylene, perfluoronaphthalene, polyvinylfluorocinnamate and combinations thereof.

2. The transistor of claim 1, wherein the fluoride material-containing layer includes polytetrafluoroethylene.

3. The transistor of claim 1, wherein the Zn-containing oxide includes a first component, and the first component is selected from the group consisting of Hf, Y, Ta, Zr, Ga, Al, In, Fe, Sc, Lu, Yb, Tm, Er, Ho, Mn, Co, Ni, Ti, Ge, Cu, Mo and combinations thereof.

4. The transistor of claim 1, wherein the gate is between the substrate and the channel layer.

5. The transistor of claim 1, wherein the channel layer is between the substrate and the gate.

6. An electronic apparatus, comprising: the transistor of claim 1.

* * * * *